United States Patent
Nishioka et al.

(10) Patent No.: US 9,245,549 B2
(45) Date of Patent: Jan. 26, 2016

(54) THERMALLY STABLE LOW RANDOM TELEGRAPH NOISE SENSOR

(71) Applicant: HGST Netherlands B.V., Amsterdam (NL)

(72) Inventors: Kouichi Nishioka, Hiratsuka (JP); Koujiro Komagaki, Odawara (JP)

(73) Assignee: HGST Netherlands B.V., Amsterdam (NL)

( * ) Notice: Subject to any disclaimer, the term of this patent is extended or adjusted under 35 U.S.C. 154(b) by 159 days.

(21) Appl. No.: 13/893,248

(22) Filed: May 13, 2013

(65) Prior Publication Data
US 2014/0334031 A1    Nov. 13, 2014

(51) Int. Cl.
G11B 5/39    (2006.01)
G11B 5/31    (2006.01)
H01L 43/08   (2006.01)

(52) U.S. Cl.
CPC ............ *G11B 5/3906* (2013.01); *G11B 5/3163* (2013.01); *H01L 43/08* (2013.01); *Y10T 428/115* (2015.01)

(58) Field of Classification Search
None
See application file for complete search history.

(56) References Cited

U.S. PATENT DOCUMENTS

| | | | |
|---|---|---|---|
| 5,589,261 A | 12/1996 | Tamari | |
| 6,080,476 A | 6/2000 | Kanbe et al. | |
| 6,635,367 B2 | 10/2003 | Igarashi et al. | |
| 6,682,826 B2 | 1/2004 | Shimizu et al. | |
| 6,706,426 B1 | 3/2004 | Yamamoto et al. | |
| 6,759,149 B1 | 7/2004 | Chen et al. | |
| 6,830,824 B2 | 12/2004 | Kikitsu et al. | |
| 6,899,964 B2 | 5/2005 | Nakamura et al. | |
| 6,916,557 B2 | 7/2005 | Hirayama et al. | |
| 7,416,794 B2 | 8/2008 | Maeda et al. | |
| 7,462,410 B2 | 12/2008 | Gouke | |
| 7,502,188 B2 | 3/2009 | Inomata et al. | |
| 7,592,080 B2 | 9/2009 | Takenoiri et al. | |
| 7,592,081 B2 | 9/2009 | Gouke | |

(Continued)

FOREIGN PATENT DOCUMENTS

| | | |
|---|---|---|
| JP | 2000-76638 A | 3/2000 |
| JP | 2000076638 A | 3/2000 |

(Continued)

OTHER PUBLICATIONS

Vallejo-Fernandez, Fernandez-Outon, and O'Grady, App. Phys. Let., 91, 212503 (2007).*

(Continued)

*Primary Examiner* — Kevin Bernatz
(74) *Attorney, Agent, or Firm* — Zilka-Kotab, PC

(57) ABSTRACT

In one embodiment, magnetic read head includes a seed layer including an amorphous alloy film and Ru film positioned thereon, and an antiferromagnetic (AFM) layer positioned above the seed layer, the AFM layer including an alloy of MnIr having an $L_{12}$ ordered phase, the amorphous alloy including a Co—X alloy having more Co than any other element, with X including at least one of: Zr, Nb, Ta, Hf, W, Si, and Al. In another embodiment, a method for forming a magnetic read head includes forming a seed layer above a substrate, heating at least the substrate to a first temperature in a range from about 150° C. to about 300° C., cooling at least the substrate to a second temperature of less than about 100° C., and forming an AFM layer above the seed layer between the heating and the cooling, the AFM layer comprising a MnIr alloy.

14 Claims, 13 Drawing Sheets

| Layer | Sensor Film A | Sensor Film B | Sensor Film E |
|---|---|---|---|
| AFM Layer | fcc | $L_{12}$ | $L_{12}$ |
| Seed Layer | Ta/Ru | Ta/Ru | Co-Hf/Ru |

(56) References Cited

U.S. PATENT DOCUMENTS

| | | | |
|---|---|---|---|
| 7,995,311 | B2 | 8/2011 | Kudo et al. |
| 8,057,926 | B2 | 11/2011 | Ayama et al. |
| 8,089,829 | B2 | 1/2012 | Akagi et al. |
| 2007/0048552 | A1* | 3/2007 | Soeya .................. 428/828 |
| 2007/0146928 | A1* | 6/2007 | Zhang et al. .................. 360/125 |
| 2007/0211392 | A1* | 9/2007 | Zeltser .................. 360/324.11 |
| 2008/0090002 | A1 | 4/2008 | Maeda et al. |
| 2008/0137236 | A1* | 6/2008 | Lee et al. .................. 360/324.11 |
| 2009/0161268 | A1* | 6/2009 | Lin .................. 360/324.11 |
| 2009/0251829 | A1* | 10/2009 | Zhang .................. G01R 33/098 360/319 |
| 2010/0173174 | A1* | 7/2010 | Imakita .................. 428/800 |
| 2011/0311841 | A1 | 12/2011 | Saito et al. |
| 2014/0334032 | A1* | 11/2014 | Nishioka et al. .................. 360/75 |

FOREIGN PATENT DOCUMENTS

| | | | |
|---|---|---|---|
| JP | 2000-215436 | A | 8/2000 |
| JP | 2000215436 | A | 8/2000 |
| JP | 2003-296913 | A | 10/2003 |
| JP | 2003296913 | A | 10/2003 |
| JP | 2010034322 | A * | 2/2010 |

OTHER PUBLICATIONS

Aley, Bonet, Lafferty, O'Grady, IEEE Trans. Mag., 45(10), 2009, 3858-3861.*

Nishioka, Hou, Fujiwara, Metzger, J. App. Phs., 80 (8), 1996, 4528-4533.*

Imakita, Tsunoda, Takahashi, App. Phys. Let., 85, 3812 (2004).*

Kohn, Kovacs, Fan, McIntyre, Ward, Goff, Sci. Reports, 3:2412, 2013, 1-7.*

JPO Abstract Translation of JP 2010-034322 A (2010).*

Machine Translation of JP 2010-034322 A (2010).*

Sayama et al., "Reduction of Medium Noise of Co—Pd Multilayered Perpendicular Magnetic Recording Media by a Thin Carbon Interlayer," 2003 IEEE, IEEE Transactions on Magnetics, vol. 39. No. 2, Mar. 2003, pp. 1059-1063.

Hosoe et al., "Thermal Aftereffects in Thin Film Magnetic Recording Media," 1998 IEEE, IEEE Transactions on Magnetics, vol. 34, No. 4, Jul. 1998, pp. 1528-1533.

Nishioka et al., "Grain size effect on ferro-antiferromagnetic coupling of NiFe/FeMn systems," Journal of Applied Physics, Oct. 1996, vol. 80, No. 8, pp. 4528-4533, abstract only.

Imakita et al., "Giant exchange anisotropy observed in Mn—Ir/Co—Fe bilayers containing ordered Mn3Ir phase," Applied Physics Letters, vol. 85, No. 17, pp. 3812-3814, abstract only.

Nishioka et al., "Thickness effect on ferro-antiferro coupling of Co/CrMnPt systems," Journal of Applied Physics, vol. 83, No. 6, Mar. 15, 1998, p. 3233-3238.

Statement of Relevance of Non-Translated Foreign Document JP2000076638.

* cited by examiner

| Layer | Sensor Film A | Sensor Film B | Sensor Film E |
|---|---|---|---|
| AFM Layer | fcc | $L1_2$ | $L1_2$ |
| Seed Layer | Ta/Ru | Ta/Ru | Co-Hf/Ru |

THERMALLY STABLE LOW RANDOM TELEGRAPH NOISE SENSOR

FIELD OF THE INVENTION

The present invention relates to magnetic data storage and retrieval, and more specifically, this invention relates to a magnetic read head having a thermally stable low random telegraph noise sensor and systems thereof.

BACKGROUND

In order to produce high recording densities in hard disk drives (HDDs) recording bit length and recording track width of a recording medium may be reduced, in one approach. In order to read data from the recording medium having the recording bits with the reduced track width, without substantial amounts of error, a track width of a read head sensor (referred to as "read head track width") and a stripe height (a depth from an air hearing surface of the read head) may also be reduced. The track width and the stripe height of the read head may be approximately 15 nm at a recording, density of 2 terabytes per square inch (Tbpsi) and approximately 5 nm at a recording density of 5 Tbpsi.

The miniaturization of the read head sensor leads to a smaller volume of the magnetic body from which the read sensor is constructed. As a result, read noise is very undesirably large due to the increased magnetic instability caused by the demagnetization field of the magnetic body. In addition, miniaturization of the sensor reduces sensor sensitivity. Therefore, problems relating to degradation of the signal-to-noise ratio (SNR) and a significant increase in the error rate are also observable. The magnetic bodies forming the read sensor film may comprise an antiferromagnetic layer, a pinned layer, and a free layer. Improvements in the magnetic stability of these magnetic bodies would be very beneficial to magnetic head manufacturing and usage.

The sensor changes resistance by using a tunneling effect of electrons in an insulated barrier layer, which is referred to as tunneling magnetic resistance (TMR). The sensor film may comprise a seed layer, an antiferromagnetic layer on the seed layer, a pinned layer formed on the antiferromagnetic layer, an insulated barrier layer formed on the pinned layer, a free layer formed on the insulated barrier layer, and a cap layer formed on the free layer.

Using this construction, low-frequency noise below about 50 MHz has been observed. The low frequency noise appears to be generated by the sensor, but attempts to reduce this noise, and to guarantee the reliability of a hard disk drive (HDD) employing such a sensor, have been unsuccessful.

A magnetic moment of the pinned layer is pinned by an exchange coupling, force from the antiferromagnetic layer. Conventionally, a MnIr disordered film having atoms arranged randomly in the antiferromagnetic layer may be used. The miniaturization of the stripe height accompanying the miniaturization of the read head increases the demagnetization field of the pinned layer, and the pinned layer becomes unstable; therefore, sensor miniaturization and a stronger exchange coupling force become necessary.

A large increase in the exchange coupling force between the antiferromagnetic layer and the ferromagnetic layer of a $L_{12}$ ordered alloy of $Mn_3Ir$ has been shown. K. Imakita et al., "Giant exchange anisotropy observed in Mn—Ir/Co—Fe bilayers containing, ordered $Mn_3Ir$ phase," Appl. Phys. Lett., 85, 3812 (2004). $L_{12}$ ordered $Mn_3Ir$ is an alloy of Mn and Ir with an ordered placement of atoms that has a structure that places Mn in the center positions of the faces in a face-centered cubic (fcc) lattice and places Ir in the corner positions. When a sputtering device is used to deposit film of MnIr at room temperature, a MnIr disordered film is obtained. When growing an $L_{12}$ ordered alloy of MnIr, it has been reported that substrate heating, high gas pressure film deposition, and cold film deposition processes are required.

A film deposition chamber capable of high-temperature film deposition and a cooling chamber capable of cooling the substrate during the film deposition process, therefore, may be used to deposit the ordered film of $Mn_3Ir$. The fabrication of an ordered alloy by hot film deposition has been attempted, and the fabrication of a $L_{12}$ ordered alloy of $Mn_3Ir$ was confirmed. The results of X-ray diffraction measurements confirmed a degree of order representing the extent of the ordered degree from 0.15 to 0.30, and a substantial increase in the value of the exchange coupling constant, Jk, that represents the strength of the exchange coupling force between the antiferromagnetic layer and the pinned layer from the conventional 0.6 erg/cm² to 1.0 erg/cm². Simultaneously, the blocking temperature, Tb, which is the temperature characteristic, substantially increased from 250° C. to 320° C.

The film thickness of the antiferromagnetic layer was thinned from 60 Å to 40 Å and used to fabricate a prototype head because Jk and Tb were greatly enhanced by producing, a $L_{12}$ ordered alloy of $Mn_3Ir$. The results were that the exchange coupling constant Jk increased from 0.6 erg/cm² to 0.9 erg/cm², and the blocking temperature Tb was the same as the conventional 250° C.

In contrast to a conventional read head, and in spite of the large increase in Jk, the prototype read head exhibited the baseline variations in the read signal waveform and experienced instability of the read waveform. The baseline variations in the read signal waveform are referred to as random telegraph noise (RTN) and are randomly generated over time. A prototype read head having a thick antiferromagnetic layer was studied, and a correlation between the generation of RTN and the antiferromagnetic layer film thickness was confirmed. Therefore, it would be beneficial to reduce the RTN which causes read errors.

SUMMARY

In one embodiment, a magnetic read head includes an antiferromagnetic (AFM) layer comprising a MnIr alloy having an $L_{12}$ ordered phase, wherein a percentage of a volume of MnIr crystal grains in the MnIr alloy having a magnetic relaxation time of about 1 millisecond (msec) or less with respect to a total volume of MnIr is less than about 3% at a maximum temperature of the magnetic read head during operation.

In another embodiment, a magnetic read head includes an AFM layer having a MnIr alloy having an $L_{12}$ ordered phase, wherein less than about 3% of polycrystalline grains forming the AFM layer have a crystal grain volume of about $1.2 \times 10^{-19}$ cm³ or less.

According to another embodiment, a magnetic read head includes a seed layer having an amorphous alloy film and as Ru film positioned thereon, along with an AFM layer positioned above the seed layer, the AFM layer including an alloy of MnIr having an $L_{12}$ ordered phase, wherein the amorphous alloy includes a Co—X alloy having more Co than any other element, wherein X includes at least one of: Zr, Nb, Ta, Hf, W, Si, and Al.

In yet another embodiment, a method for forming a magnetic read head includes forming a seed layer above a substrate, the seed layer having an amorphous alloy film of Co—X alloy below a Ru film, wherein the Co—X alloy includes more Co than any other element, wherein X includes at least one of: Zr, Nb, Ta, Hf, W, Si, and Al; heating at least the substrate to a first temperature in a range from about 150° C. to about 300° C.; cooling at least the substrate to a second temperature of less than about 100° C.; and forming an AFM layer above the seed layer between the hating and the cooling, the AFM layer including a MnIr alloy.

Any of these embodiments may be implemented in a magnetic data storage system such as a disk drive system, which may include a magnetic head, a drive mechanism for passing a magnetic storage medium (e.g., hard disk) over the head, and a control unit electrically coupled to the head for controlling operation of the head.

Other aspects and advantages of the present invention will become apparent from the following detailed description, which, when taken in conjunction with the drawings, illustrate by way of example the principles of the invention.

DETAILED DESCRIPTION

Figures 1A, 1B:
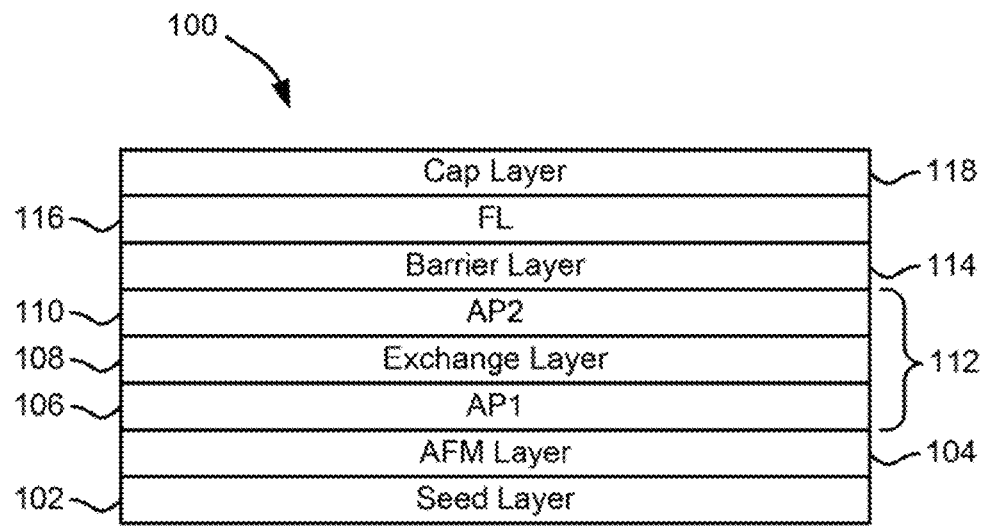
FIG. 1A is a schematic diagram of a laminated structure of a TMR sensor.
FIG. 1B shows a table for materials and structures in various exemplary laminated structures of a TMR sensor.

The following description is made for the purpose of illustrating the general principles of the present invention and is not meant to limit the inventive concepts claimed herein. Further, particular features described herein can be used in combination with other described features in each of the various possible combinations and permutations.

Unless otherwise specifically defined herein, all terms are to be given their broadest possible interpretation including meanings implied from the specification as well as meanings understood by those skilled in the art and/or as defined in dictionaries, treatises, etc.

It must also be noted that, as used in the specification and the appended claims, the singular forms "a," "an" and "the" include plural referents unless otherwise specified.

In one general embodiment, a magnetic read head includes an antiferromagnetic (AFM) layer comprising a MnIr alloy having an $L_{12}$ ordered phase, wherein a percentage of a volume of MnIr crystal grains in the MnIr alloy having a magnetic relaxation time of about 1 millisecond (msec) or less with respect to a total volume of MnIr is less than about 3% at a maximum temperature of the magnetic read head during operation.

In another general embodiment, a magnetic read head includes an AFM layer having a MnIr alloy having an $L_{12}$ ordered phase, wherein less than about 3% of polycrystalline grains forming the AFM layer have a crystal grain volume of about $1.2 \times 10^{-19}$ cm$^3$ or less.

According to another general embodiment, a magnetic read head includes a seed layer having an amorphous alloy film and a Ru film thereon, along with an AFM layer positioned above the seed layer, the AFM layer including an alloy of MnIr having an $L_{12}$ ordered phase, wherein the amorphous alloy includes more Co than any other element in a Co—X alloy, wherein X includes at least one of: Zr, Nb, Ta, Hf, W, Si, and Al.

In yet another general embodiment, a method for forming a magnetic read head includes forming a seed layer above a substrate, the seed layer including an amorphous alloy film positioned below a Ru film, wherein the amorphous alloy includes a Co—X alloy having more Co than any other element, wherein X includes at least one of: Zr, Nb, Ta, Hf, W, Si, and Al; heating, at least the substrate to a first temperature in a range from about 150° C. to about 300° C.; cooling at least the substrate to a second temperature of less than about 100° C.; and forming an AFM layer above the seed layer between the heating and the cooling, the AFM layer including a MnIr alloy.

Focusing on the AFM layer adjacent to the pinned layer of a read head, the time and temperature characteristics of thermal magnetic fluctuations were examined. When the volume percentage of AFM crystal grains having frequencies of the fluctuations is plotted with respect to the frequency of the magnetic thermal fluctuations of the AFM crystal, as the frequency of the fluctuations decreased, the number of AFM layer crystal grains increases (for more details, see FIG. 6). In other words, there is a large number of AFM crystals that have a low frequency and slow fluctuations. This kind of frequency dependence is referred to as 1/f noise. There are almost no components having high-frequency fluctuations particularly above the frequency of 50 MHz. In the frequency band below 50 MHz, the number of AFM crystal grains increases rapidly with the decrease in frequency.

This tendency is identical to the frequency characteristics of random telegraph noise, which is the main noise of a read head. Thus, it is clear that the main source of read head noise is the magnetic fluctuations of the AFM crystals.

The noise that negatively affects the read process of the read head is random telegraph noise having frequencies of at least 1 kHz. At frequencies below 1 kHz, the probability of interfering with the signal read is low because the generation frequency is small with respect to the frequency of the read signal, in one approach.

Thus, to suppress noise that negatively affects the signal read process, the AFM crystal grains having magnetic fluctuations at frequencies above 1 kHz are reduced.

According to one embodiment, the AFM layer may comprise a MnIr alloy having the $L_{12}$ ordered phase in one approach, of the polycrystalline grains forming the AFM layer, the total volume of the crystal grains (crystal nanograms) having a crystal gram volume of less than or equal to about $1.2 \times 10^{-19}$ cm$^3$ may be about 3%, and preferably about 1% and less, than a volume of the entire AFM layer (derived while considering the correlation of the magnetic anisotropic energy of the crystal grains and the frequency).

In another embodiment, a volume ratio of the MnIr crystal grains having a magnetic relaxation time $\tau(=1/f)$ of about 1 msec or shorter with respect to the total volume of MnIr may be no more than about 3%, and preferably about 1%, at a maximum temperature of the read head in practical applications such as during operation of the read head to read data from a magnetic medium for a period to time. The maximum temperature may be determined easily via experimentation, by passing the sense current therethrough until a steady state temperature is achieved and measuring the temperature, and preferably in an environment similar to that of actual use.

The frequencies of the random telegraph noise generated by the magnetic fluctuations of the AFM crystal grains are smaller when the magnetic anisotropic energy of the AFM crystal grains is large, and may be controlled to have frequencies below about kHz that do not affect the reading of the read signal by adjusting the magnetic anisotropic energy of the crystal grains. Conversely, the frequencies of the magnetic fluctuations of AFM crystal grains become larger when the magnetic anisotropic energy of the AFM crystal grains is small, and becomes random telegraph noise above about 1 kHz that negatively affects the reading of the read signal when the magnetic anisotropic energy of the crystal grains is less than the specified value. Consequently, the read head structures described herein according to various embodiments allow for the magnetic anisotropic energy of the AFM crystal grains to be proportional to the volume of the crystal grains.

To reduce the MnIr of the crystal nanograins, the seed layer material is appropriately selected. In one approach, MnIr having an $L_{12}$ ordered alloy may be laminated to a thickness of at least about 50 Å on a multilayer seed film of Ru laminated on an amorphous alloy film comprising Co, preferably as a major component (equaling greater than about 50% of the material). Thus, of the polycrystalline grains forming MnIr, a total volume of crystal grains having a crystal grain volume of no more than about $1.2 \times 10^{-19}$ cm$^3$ may be less than about 3%, and preferably about 1%, of the volume of the entire MnIr. The amorphous alloy comprising Co may be a Co—X alloy, where X includes at least one of the following, elements: Zr, Nb, Ta, Hf, W, Si, and Al. Of course, other elements may be used.

In one approach, the structure of the read head may be laminated MnIr layers having an $L_{12}$ ordered alloy on a seed film of a Ru film laminated on a Ta alloy film. Of the polycrystals forming MnIr, the total volume of the crystal grains having a crystal grain volume of $1.2 \times 10^{-19}$ cm$^3$ or smaller may be no more than about 3%, and preferably about 1%, of the volume of the entire MnIr. The Ta alloy film may be a Ta—X alloy, where X includes at least one of Si and Al.

A read head according to another embodiment may be manufactured using a manufacturing method that has a process that deposits an amorphous alloy film comprising Co on a substrate, deposits a Ru film above the amorphous alloy film, and forms MnIr above the Ru film after heating the substrate to between about 150° C. and about 300° C., then cools the substrate.

FIG. 1A shows a sensor 100 having a laminated structure. An AFM layer 104 is formed above a seed layer 102. The AFM layer 104 may comprise MnIr and is strongly magnetically coupled by exchange coupling with the ferromagnetic layer AP1 106 formed thereabove. A ferromagnetic layer (AP2) 110 is strongly antiparallel coupled to the ferromagnetic layer (AP1) 106 through a thin exchange layer 108 which may comprise Ru. AP1/exchange/AP2 is referred to as the pinned layer 112. The magnetic moment of the pinned layer 112 is strongly pinned by the AFM layer 104. An insulated barrier layer 114 which may comprise MgO, is positioned above the AP2 110, and a ferromagnetic free layer (FL) 116 is positioned above the barrier layer 114, then a cap layer 118 is positioned above the free layer 116. The free layer 116 responds to an external, magnetic field. The direction of the magnetic moment of the free layer 116 is changed by an external magnetic field.

The process for reading magnetic information recorded on a recording medium using a tunneling magnetoresistive (TMR) sensor is as follows. The direction of the magnetic moment of the free layer 116 is changed by the leaking magnetic field from the medium. When the direction of the magnetic moment of the free layer 116 changes, the sensor resistance changes and is detectable as a voltage signal.

Now referring to FIG. 1B, the three sensor films A, B, and E may be fabricated via sputtering. Sensor films A and B have a seed layer of Ta 15 Å/Ru 20 Å, and sensor film E has a seed layer of CoHf 40 Å/Ru 20 Å. The Hf composition of CoHf is 23 at % and the layer has an amorphous structure. The composition of MnIr is 22 at % Ir. In sensor film A, the substrate temperature during MnIr deposition is room temperature. In sensor films B and E, the substrate temperature is increased to 200° C. and deposition is performed at these temperatures.

Figure 2A:
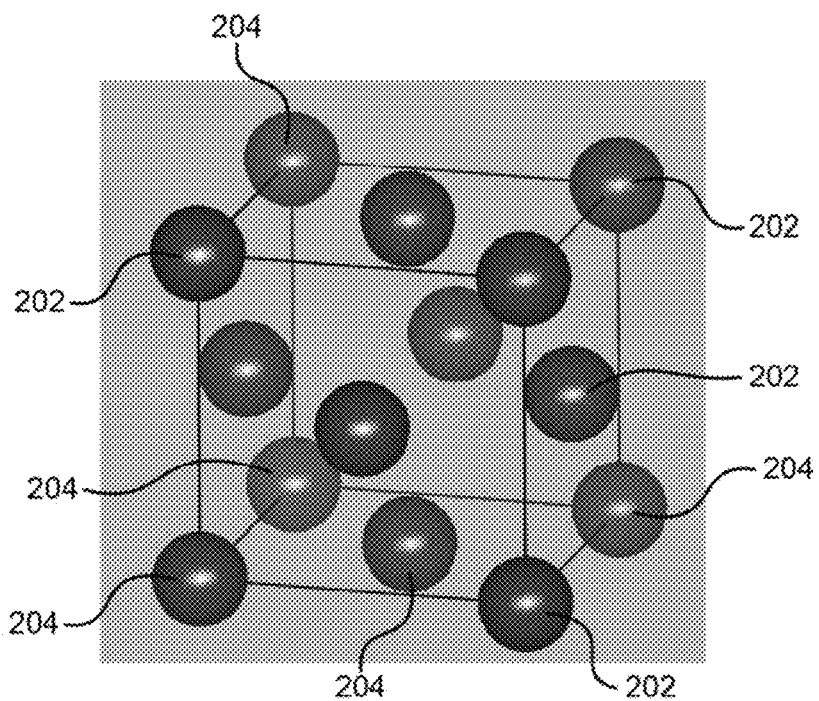
FIG. 2A shows a diagram of a face-centered cubic (fcc) crystal of MnIr.
Figure 2B:
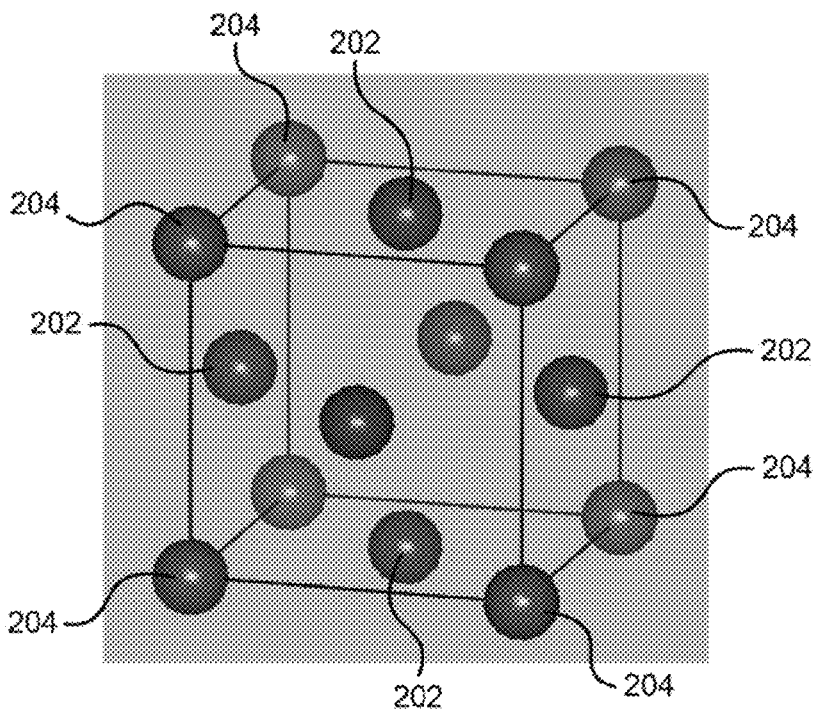
FIG. 2B shows a crystal structure of $L_{12}$ MnIr.

FIG. 2A shows the MnIr structure of a face-centered cubic (fcc) disordered phase MnIr and FIG. 2B shows the MnIr structure of a $L_{12}$ ordered phase. In the former, the Mn atoms 202 and Ir atoms 204 randomly occupy the lattice positions in a fcc lattice. As shown in FIG. 2A, there is no specific ordering of the atoms, and thus they are all represented to appear the same. The particular selection of which atoms are which is for exemplary purposes only, and any random ordering could be produced. $L_{12}$ ordered phase MnIr is an alloy having an atom arrangement with a structure that places Mn atoms 202 in the center positions of the faces of the fcc lattice and places Ir atoms 204 in the corner positions.

The results of a detailed study of magnetic fluctuations in the MnIr AFM layer forming each of the sensors A, B, E showed that the fluctuations are caused by random telegraph noise in the low frequency range of the playback head. The crystal properties and temperature characteristics of MnIr are described below.

Figure 3:
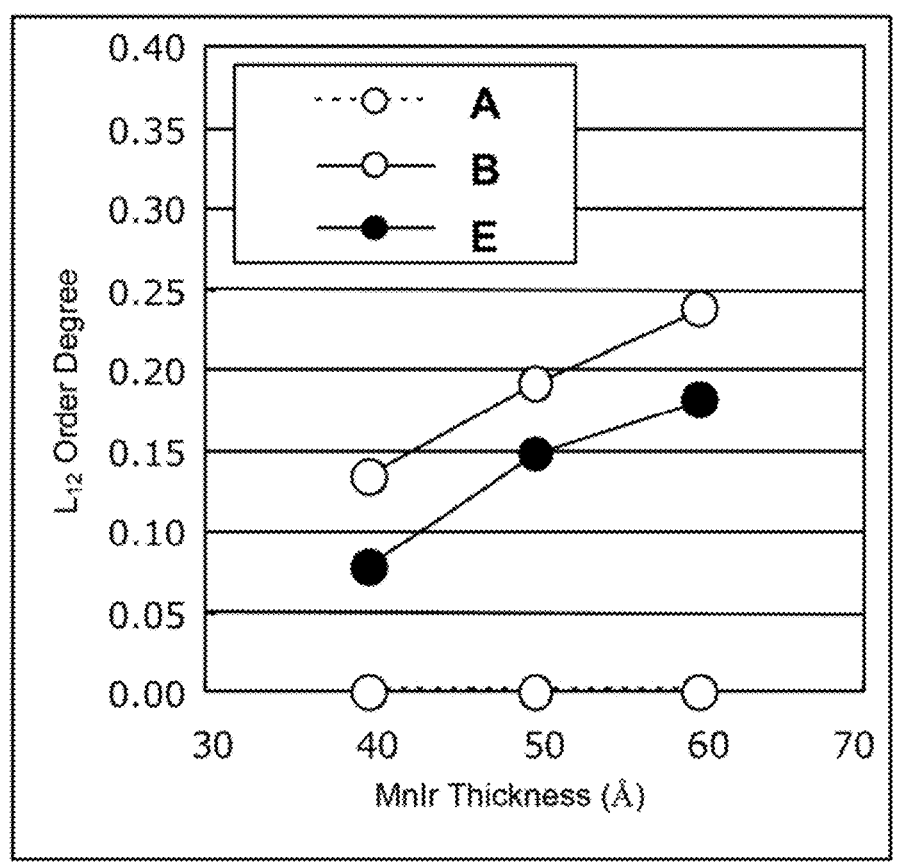
FIG. 3 shows the degree of order of the $L_{12}$ structure of each sensor film A, B, and E.

FIG. 3 shows the results of measuring the degree of order of the $L_{12}$ ordered phase MnIr. The results show that sensor film A has a degree of order of zero for all MnIr film thicknesses and becomes fcc disordered MnIr. Sensor films B and E have a degree of order of an $L_{12}$ ordered phase that increases with the MnIr film thickness, and the degree of order at a 60 Å film thickness exhibits a value of approximately 0.2 to 0.3.

Figure 4:
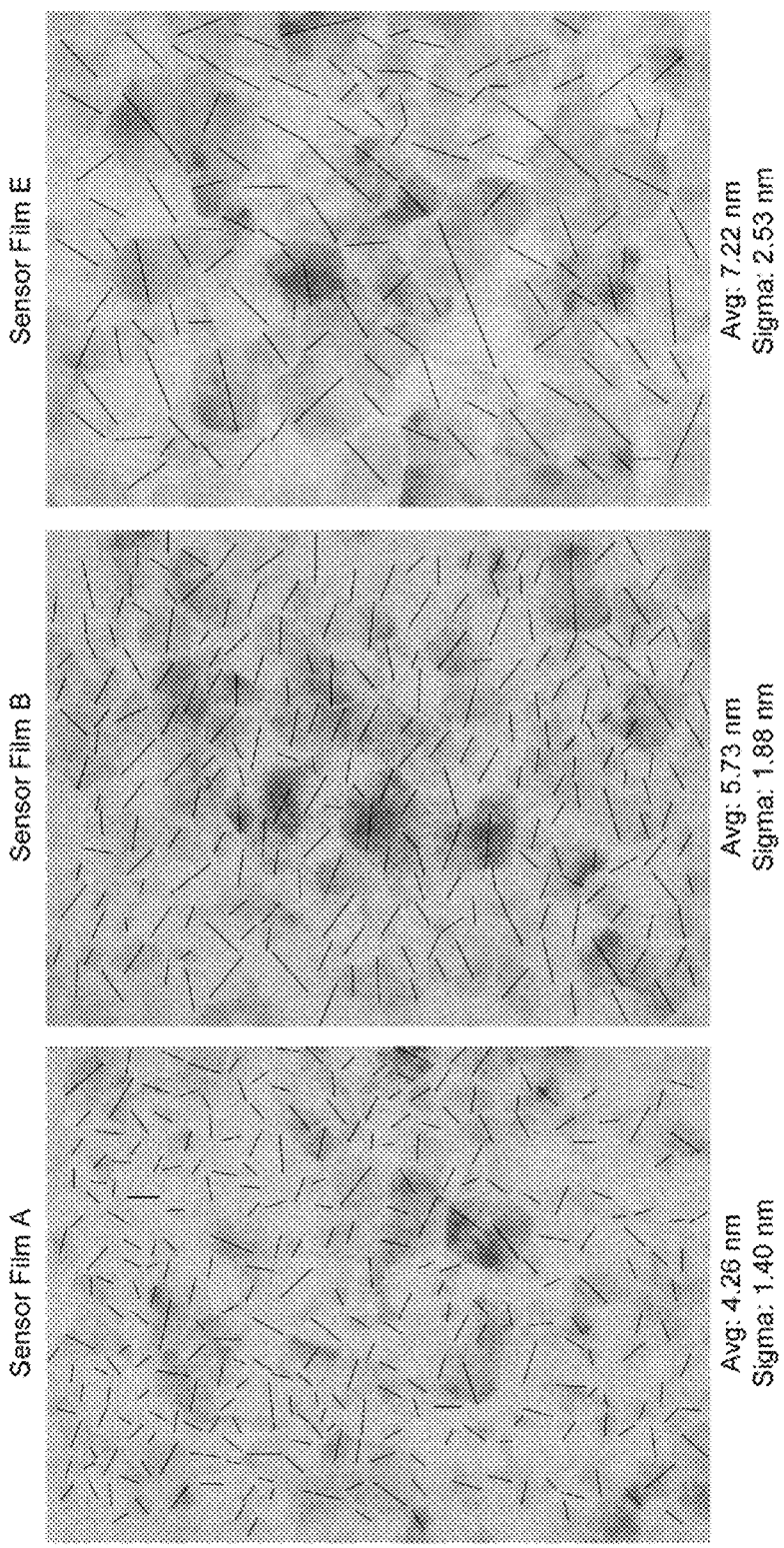
FIG. 4 shows analysis of MnIr crystal grain sizes for each sensor film A, B, and E.

In addition, the MnIr crystal grain size of these sensors is determined by observations using a transmission electron microscope. FIG. 4 shows the results. Compared to sensor film A that comprises deposited MnIr at room temperature, sensor film B that used the same seed structure and hot film deposition has a somewhat larger crystal grain size. In sensor film E that used a different seed and hot film deposition, the crystal grains are coarser. The average crystal grain size of sensor film A is 43 Å; and the variance of the grain size is 14 Å. The average crystal grain size of sensor film B is 57 Å; and the variance of the grain size is 19 Å. The average crystal grain size of sensor film E is 72 Å; and the variance of the grain size is 25 Å.

Figure 10A:
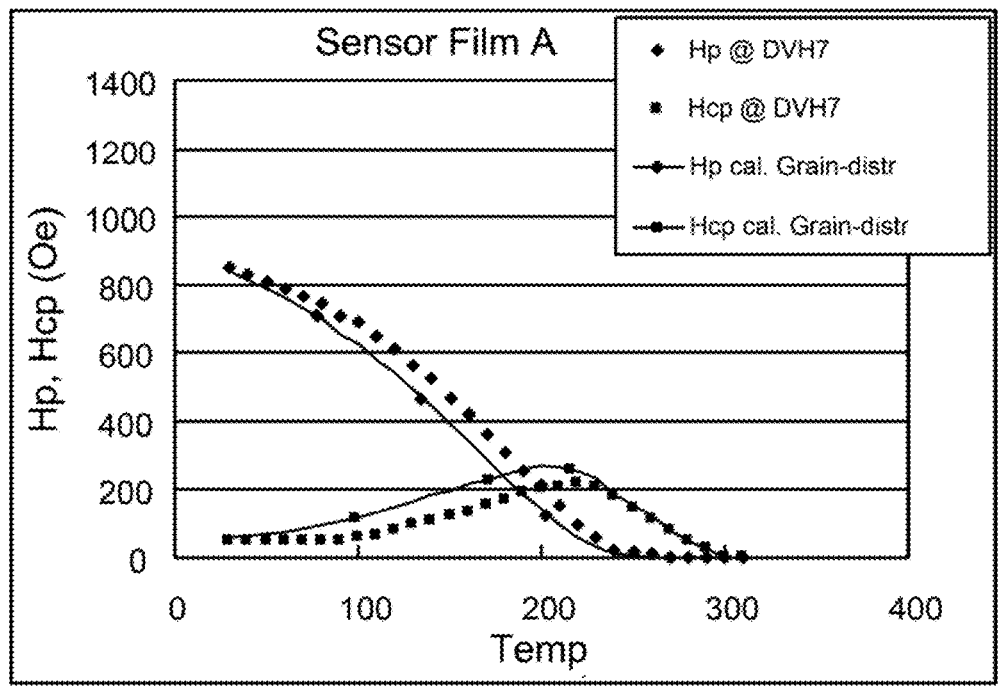
FIG. 10A shows empirical results and calculation results of exchange coupling magnetic field Hp of MnIr and AP1 and the temperature changes of the coercive force for sensor film A.
Figure 10B:
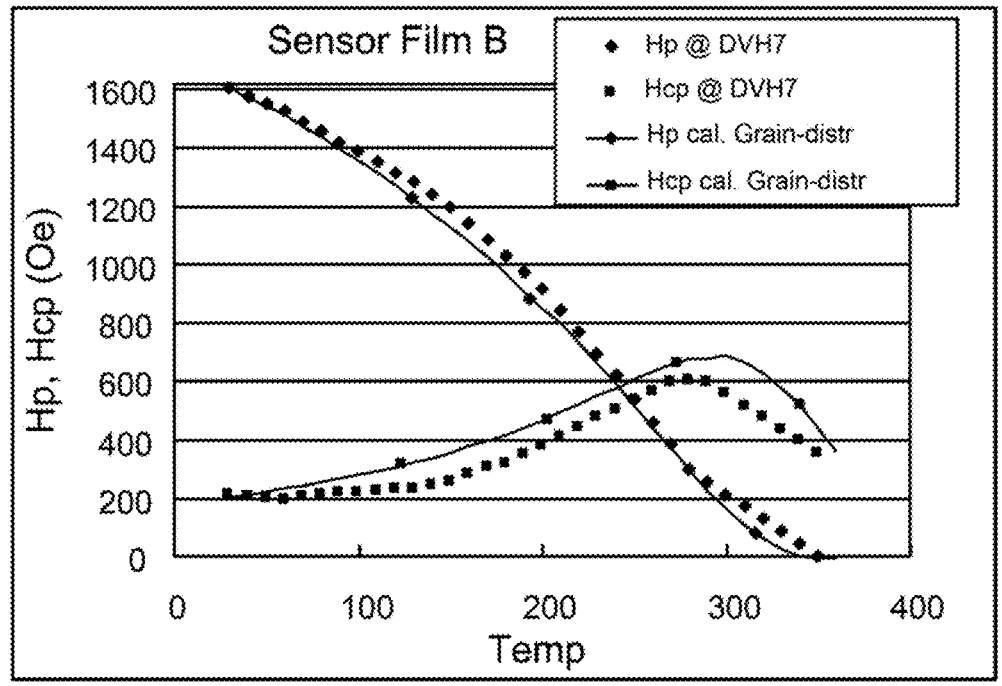
FIG. 10B shows empirical results and calculation results of exchange coupling magnetic field Hp of MnIr and AP1 and the temperature changes of the coercive force for sensor film B.
Figure 10C:
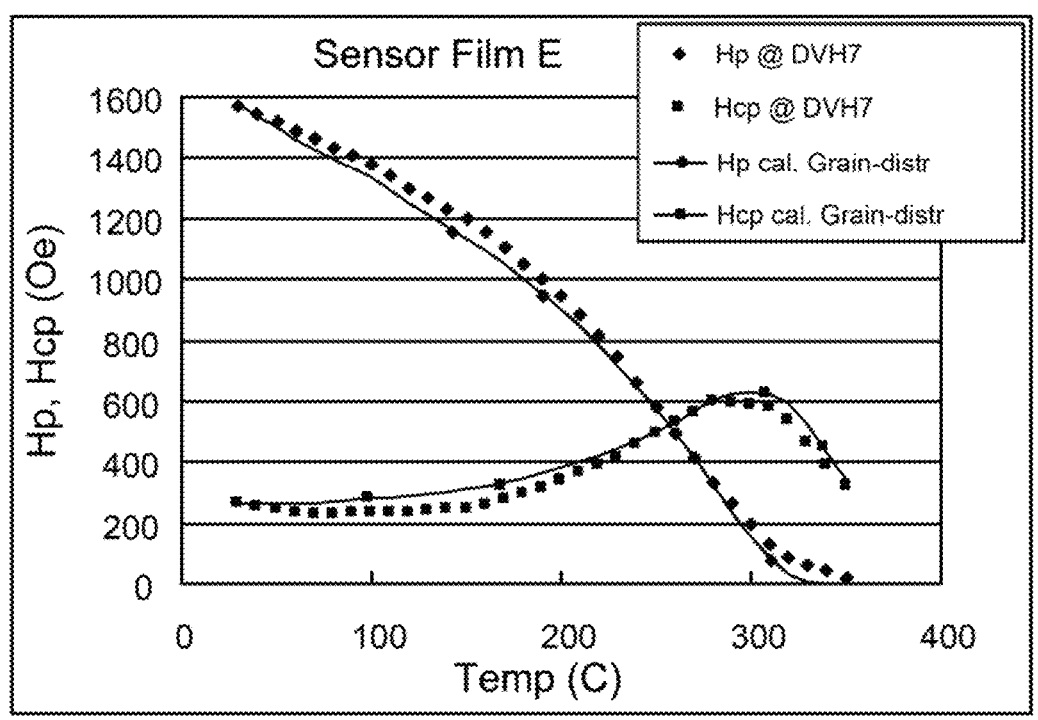
FIG. 10C shows empirical results and calculation results of exchange coupling magnetic field Hp of MnIr and AP1 and the temperature changes of the coercive force for sensor film E.

FIGS. 10A-10C show the temperature dependence of the exchange coupling magnetic field Hp between the AFM layer and the AP1 of each sensor (sensor film A in FIG. 10A, sensor film B in FIG. 10B, and sensor film E in FIG. 10C) and the coercive force Hc. Hp decreased with the temperature and became zero near 250° C. in sensor film A and near 350° C. in sensor films B and E. The temperature where Hp becomes zero is referred to as the blocking temperature Tb. The coercive force Hc increases with the temperature and becomes the maximum in the vicinity of the blocking temperature Tb of each sensor, and then decreases. The behaviors of the temperature dependence of Hc and Hp of the exchange coupling film of the AFM layer and the ferromagnetic layer of a polycrystalline structure are explained in more detail in K. Nishioka et. al., "Grain size elect on ferro-antiferro coupling of NiFe/FeMn systems," J. Appl. Phys., 80, 4528 (1996), and K. Nishioka et. al., "Thickness effect on ferro-antiferro coupling of Co/CrMnPt systems," J. Appl. Phys., 83, 3233 (1998).

Figure 5:
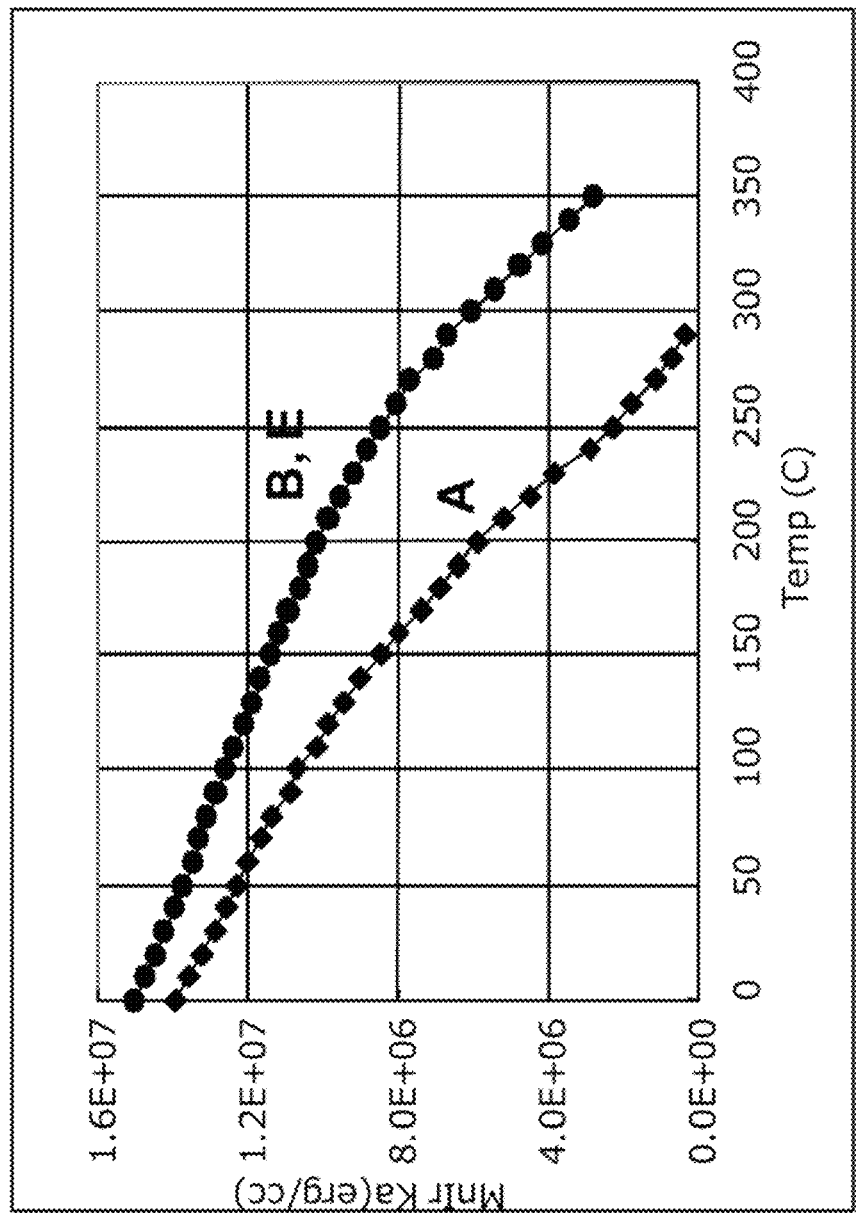
FIG. 5 shows temperature dependence of magnetocrystalline anisotropic constant Ka of MnIr for each sensor film A, B, and E.

The temperature changes of Hp and Hc calculated by using the distribution of the crystal grain size obtained in FIG. 4 are indicated by the solid line in FIGS. 10A-10C with the parameter of the magnetocrystalline anisotropic constant of MnIr. The calculation results are explained by empirical results, FIG. 5 shows the temperature changes of the crystal magnetic anisotropic constant Ka of the MnIr obtained by calculations. In sensor films B and F having a $L_{12}$ ordered phase MnIr, a large magnetocrystalline anisotropic constant Ka is exhibited compared to sensor film A that does not have a $L_{12}$ ordered phase MnIr. The temperature where Ka is extinguished (Neel temperature) is near 400° C. and has a higher value in sensor films B and E, compared to the 300° C. of sensor film A. The reason that a large magnetocrystalline anisotropic constant Ka is exhibited in sensor films B and E is that the MnIr becomes $L_{12}$ ordered alloy.

Figure 6:
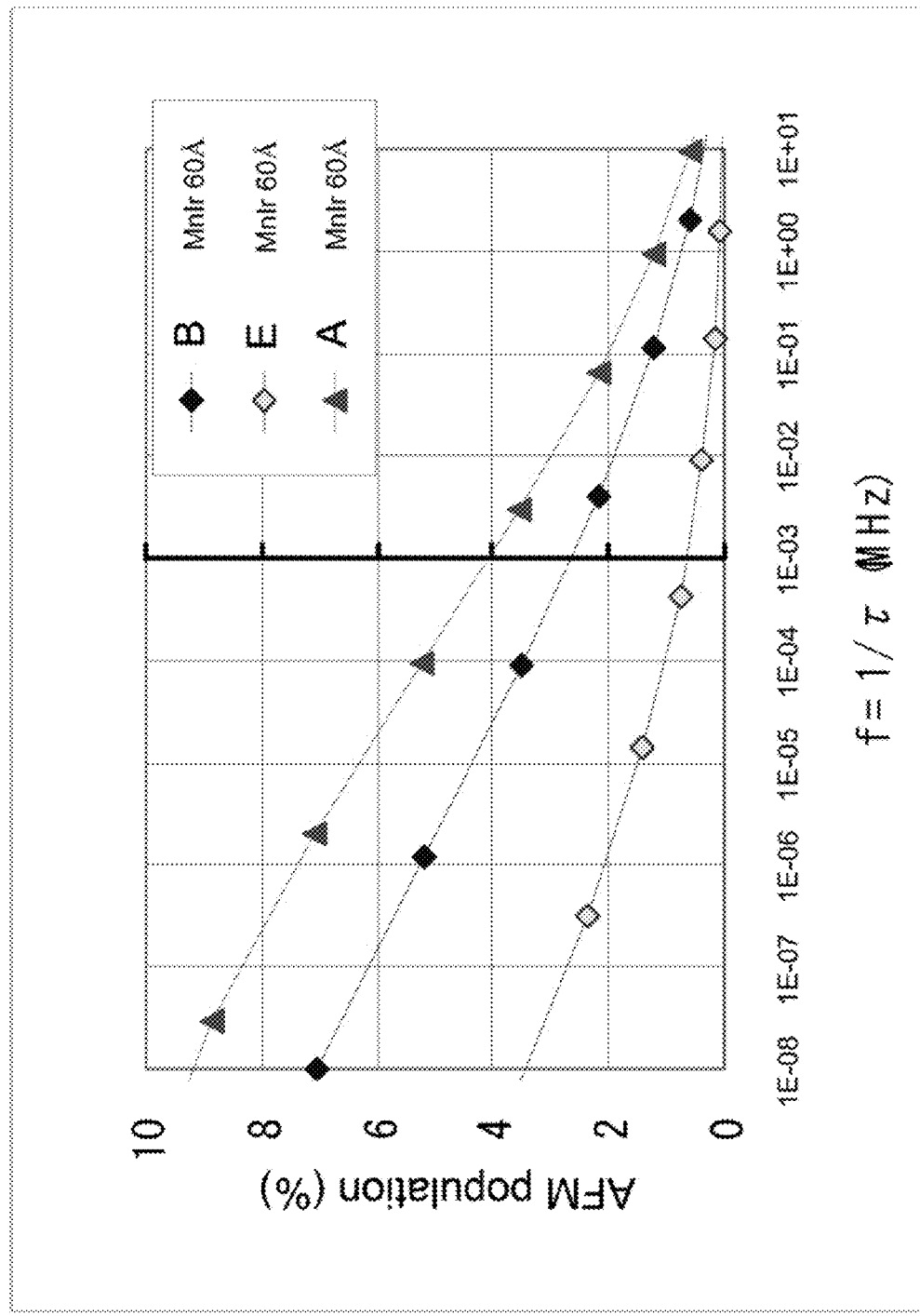
FIG. 6 shows the frequency dependence of the MnIr population with the magnetic fluctuation frequency (f) for each sensor film A, B, and E.

From these calculation results, the magnetic fluctuations of the AFM MnIr crystal grains of each sensor film may be determined. FIG. 6 is a graph of the percentage of MnIr crystals that fluctuate at the frequencies of the magnetic fluctuations. For any test sample, as the fluctuation frequency becomes smaller, the AFM crystal grains increase. In other words, there are many AFM crystals that have a low frequency and fluctuate slowly, and there are few crystal grains fluctuating rapidly at high frequencies. This frequency dependence is the so-called noise. When the measured samples are compared, sensor films B and E that have $L_{12}$ ordered phase MnIr have small noise components compared to sensor film A that does not have $L_{12}$ ordered phases. The reason for large noise components in sensor film A compared to sensor films B and E in all frequency regions is thermal instability because the crystal grain sizes of MnIr are small and the magnetocrystalline anisotropic constant Ka is small, and the magnetocrystalline anisotropic energy represented by the product of the MnIr crystal grain and Ka is small.

In addition, the reason sensor film E, that uses a Co amorphous alloy in the seed layer, has a smaller noise component than sensor film B, that uses a Ta seed layer, is the large magnetocrystalline anisotropic energy because the crystal grain size is large for sensor film E as shown in FIG. 4 compared to sensor film B.

Figure 7:
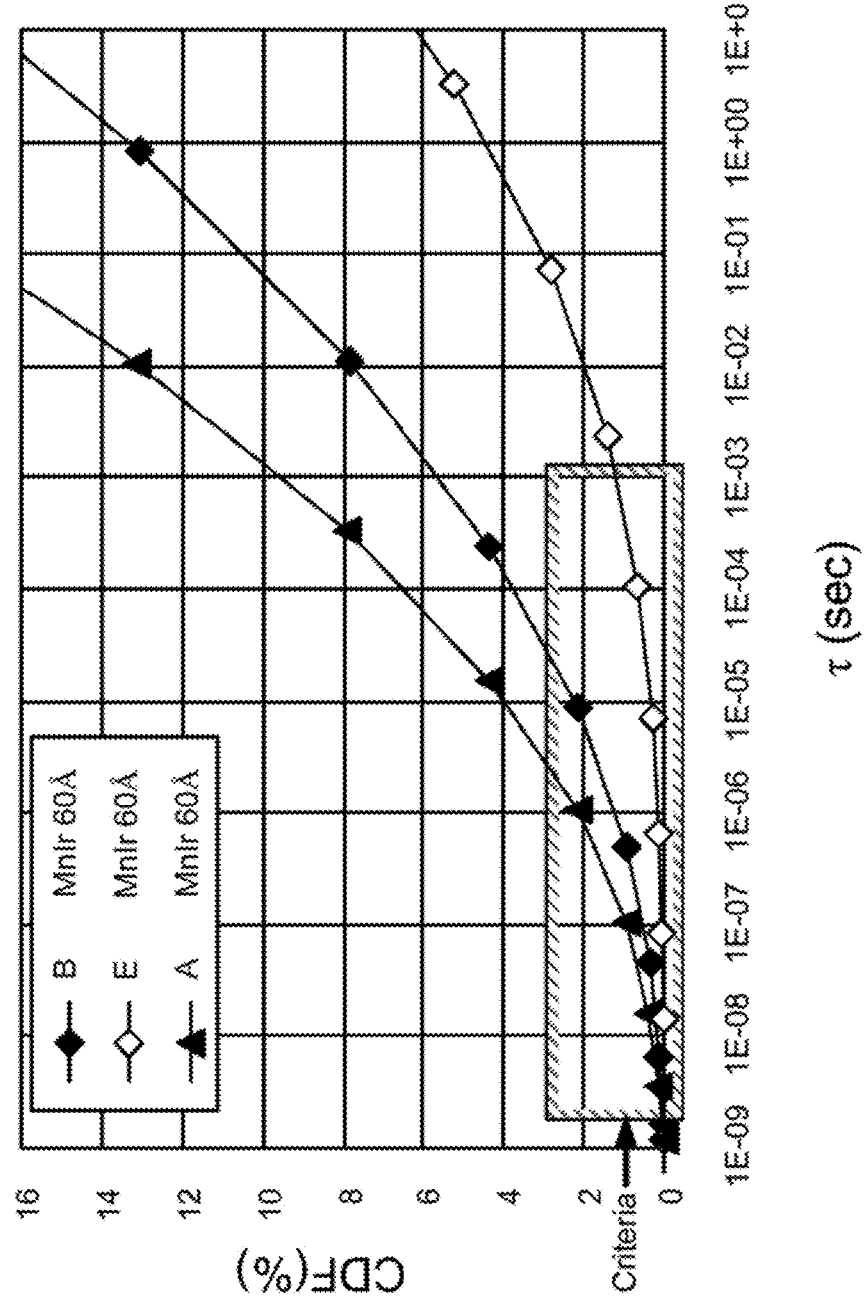
FIG. 7 shows the MnIr component of magnetic fluctuations within time τ for each sensor film A, B, and E.

FIG. 7 is a graph of the results in FIG. 6 plotted as the percentage of MnIr crystal grains having a relaxation time below the relaxation time, $\tau$, of noise, which is the inverse of the magnetic fluctuation frequency, with the horizontal axis being the relaxation time. Each curve has a noise component that is nearly zero at f=100 MHz ($\tau=1\times10^{-8}$ seconds) and rapidly increases from f=50 MHz ($\tau=5\times10^{-8}$ seconds) and lower frequencies. These characteristics are identical to the random telegraph noise observed at the read head. Thus, magnetic fluctuations of the AFM crystals are believed to be the cause of the random telegraph noise.

In addition, the random telegraph noise that negatively affects the interpretation of the read signal is the magnetic fluctuations of the AFM crystals having frequencies mostly above 1 kHz. To guarantee stable performance of the read head, sensor film E should be used. Thus, the percentage of AFM crystals having frequencies above 1 kHz may be no more than about 3%, and preferably 1%.

Figure 8:
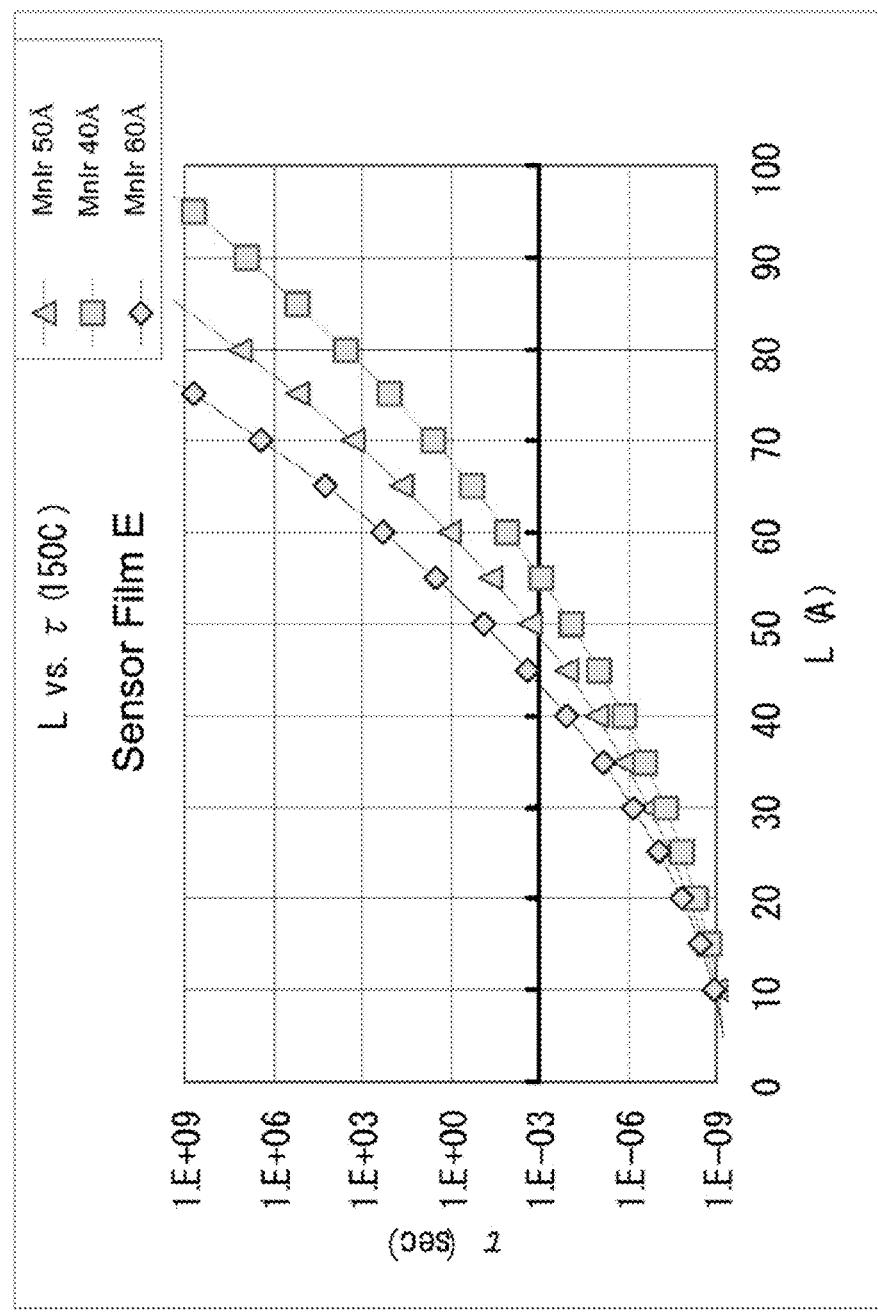
FIG. 8 shows the relationship between MnIr crystal grain size and magnetic relaxation time τ for sensor film E.

FIG. 8 shows the results for sensor film E of the relationship between the MnIr crystal grain size and the relaxation time $\tau$ of magnetic fluctuations where the film thicknesses of MnIr were set to 40 Å, 50 Å, and 60 Å. As the MnIr becomes thick, $\tau$ becomes large. As the crystal grain size becomes large, $\tau$ becomes large. The reason is that the magnetocrystalline anisotropic energy of the crystal grains becomes large as the film becomes thicker and the grain size increases. The MnIr crystal grain size, Lc, at the critical boundary where the relaxation time is $\tau=1$ msec becomes larger as the MnIr thickness becomes thinner, from 60 Å to 50 Å to 40 Å. This is believed to occur because $\tau$ is determined by the volume of the AFM crystal grains, and $\tau$ is not determined by the grain size.

Figure 9:
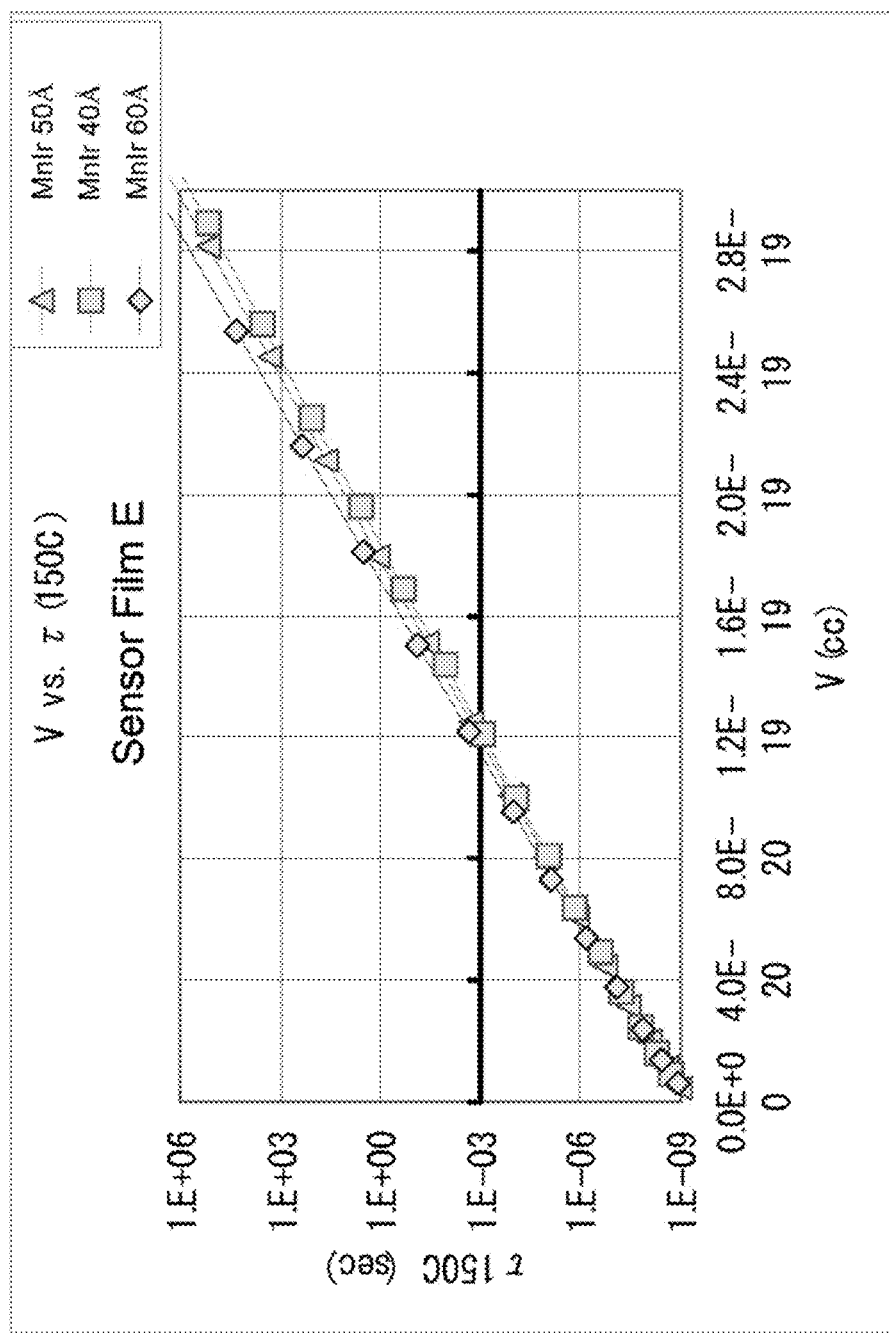
FIG. 9 shows the relationship between MnIr crystal grain volume and magnetic relaxation time τ for sensor film E.

FIG. 9 is a graph of the relaxation time of noise where the volume of the AFM crystal grains is the horizontal axis for sensor films having different MnIr film thicknesses. The result is that nearly the same straight line is found even for different MnIr film thicknesses. Thus, the relaxation time of noise is determined by the volume of the crystal grains when the magnetocrystalline anisotropic constant is the same. For sensor films B and E, the MnIr crystal grain volume Vc is $1.2\times10^{-19}$ cm$^3$ at the critical region where the relaxation time is $\tau=1$ msec.

Figure 11:
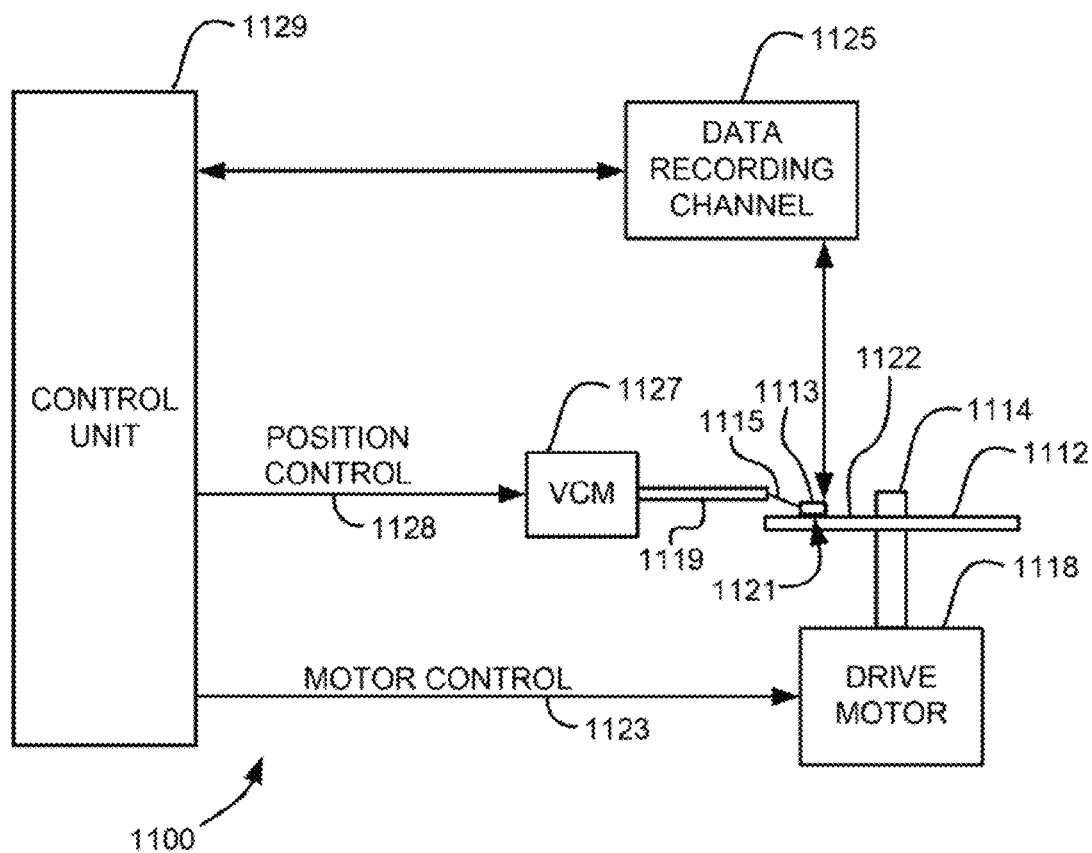
FIG. 11 is a simplified drawing, of a magnetic recording, disk drive system.
Figure 12:
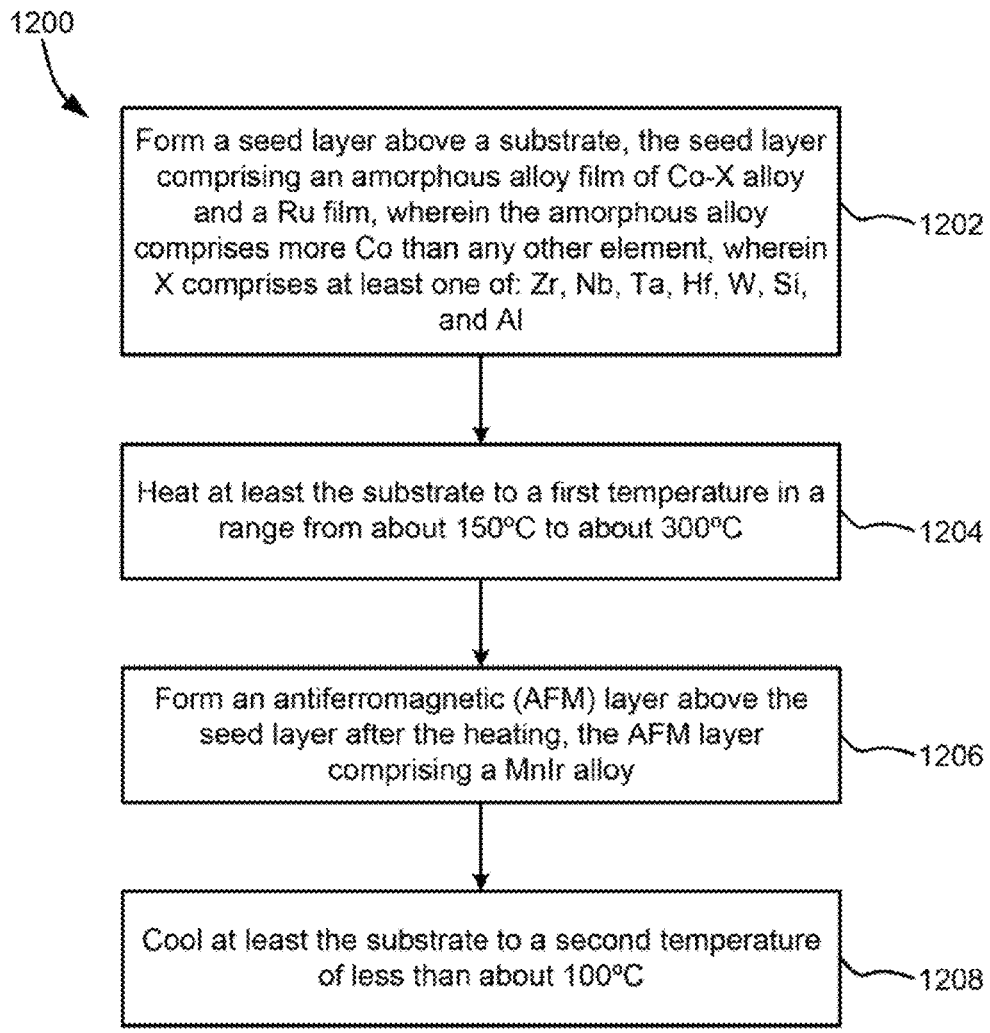
FIG. 12 is a flowchart of a method in accordance with one embodiment.

Referring now to FIG. 11, there is shown a magnetic data storage system, e.g., a disk drive 1100, in accordance with one embodiment of the present invention. As shown in FIG. 11, at least one magnetic storage medium, e.g., a rotatable magnetic disk 1112, is supported on a spindle 1114 and rotated by a drive mechanism, which may include a disk drive motor 1118. The magnetic recording on each disk is typically in the form of an annular pattern of concentric data tracks (not shown) on the disk 1112.

At least one slider 1113 is positioned near the disk 1112, each slider 1113 supporting one or more magnetic read/write heads 1121. As the disk rotates, slider 1113 is moved radially in and out over disk surface 1122 so that heads 1121 may access different tracks of the disk where desired data are recorded and/or to be written. Each slider 1113 is attached to an actuator arm 1119 by means of a suspension 1115. The suspension 1115 provides a slight spring force which biases slider 1113 against the disk surface 1122. Each actuator area 1119 is attached to an actuator 1127. The actuator 1127 as shown in FIG. 11 may be a voice coil motor (VCM). The VCM comprises a coil movable within a fixed magnetic field, the direction and speed of the coil movements being controlled by the motor current signals supplied by controller 1129.

During operation of the disk storage system, the rotation of disk 1112 generates an air bearing between slider 1113 and disk surface 1122 which exerts an upward force or lift on the slider. The air bearing thus counter-balances the slight spring force of suspension 1115 and supports slider 1113 off and slightly above the disk surface by a small, substantially constant spacing during normal operation. Note that in some embodiments, the slider 1113 may slide along the disk surface 1122.

The various components of the disk storage system are controlled in operation by control signals generated by controller 1129, such as access control signals and internal clock signals. Typically, controller 1129 comprises logic control circuits, storage e.g., memory), and a microprocessor. The controller 1129 generates control signals to control various system operations such as drive motor control signals on line 1123 and head position and seek control signals on line 1128. The control signals on line 1128 provide the desired current profiles to optimally move and position slider 1113 to the desired data track on disk 1112. Read and write signals are communicated to and from read/write heads 1121 by way of recording channel 1125.

The above description of a typical magnetic disk storage system, and the accompanying illustration of FIG. 11 is for representation purposes only. It should be apparent that disk storage systems may contain a large number of disks and actuators, and each actuator may support a number of sliders.

An interface may also be provided for communication between the disk drive and a host (integral or external) to send and receive the data and for controlling the operation of the disk drive and communicating the status of the disk drive to the host, all as will be understood those of skill in the art.

In another embodiment, a method 1200 forming a magnetic read head is shown according to one embodiment. As an option, the present method 1200 may be implemented to construct structures such as those shown in FIG. 1A. Of course, however, this method 1200 and others presented herein may be used to form magnetic structures for a wide variety of devices and/or purposes which may or may not be related to magnetic recording. Further, the methods presented herein may be carried out in any desired environment. It should also be noted that any aforementioned features may be used in any of the embodiments described in accordance with the various methods.

In operation 1202, a seed layer is formed above a substrate, such as via sputtering, plating, vapor deposition, or any other known technique in the art. The seed layer may comprise an amorphous alloy film of Co—X alloy. The Co—X alloy comprises more Co (Co is a major component) than any other element, with X being selected from a group which includes at least one of: Zr, Nb, Ta, Hf, W, Si, and Al, that is, X may be more than one element in the group. In a further approach, the seed layer may further comprise a Ru film positioned above the Co—X alloy film.

In operation 1204, at least the substrate is heated (the seed layer may also be heated) to a first temperature in a range from about 150° C. to about 300° C. The heating may be accomplished using any technique known in the art, such as passing heated air across the substrate, holding the substrate in an environment having an elevated temperature, such as an oven, etc.

In operation 1206, an AFM layer is formed above the seed layer after the heating 1204, such as between the heating 1204 and the cooling 1208, the AFM layer comprising a MnIr alloy. Any method of forming may be used as would be understood by one of skill in the art.

In operation 1208, at least the substrate is cooled (the seed layer may also be cooled) to a second temperature of less than about 100° C. Any technique for cooling the substrate may be used, such as waiting while the substrate is in a lower temperature environment, passing cooler air over the substrate, etc.

The method 1200 may further include forming a first ferromagnetic layer (AP1) above the AFM layer, forming an exchange layer above the first ferromagnetic layer, forming a second ferromagnetic layer (AP2) above the exchange layer (the first ferromagnetic layer, the exchange layer, and the second ferromagnetic layer forming a pinned layer), forming a barrier layer above the pinned layer, and forming a ferromagnetic free layer above the barrier layer. The ferromagnetic free layer is adapted to respond to an external magnetic, field, a magnetic moment of the pinned layer is strongly pinned by the AFM layer, the AFM layer is strongly magnetically coupled by exchange coupling with the first ferromagnetic layer, the second ferromagnetic layer is strongly antiparallel coupled by the AFM layer, and the barrier layer comprises MgO.

In a further approach, the MnIr alloy may have an $L_{12}$ ordered phase, and a percentage of a volume of MnIr crystal grains in the MnIr alloy having a magnetic relaxation tune of about 1 msec or less with respect to a total volume of MnIr may be less than about 3% (and less than about 1% in some approaches) at a maximum temperature of the magnetic read head during operation.

In another further approach, the MnIr alloy may have an $L_{12}$ ordered phase, and less than about 3% (and less than about 1% in some approaches) of polycrystalline grains forming the AFM layer have a crystal grain volume of about $1.2 \times 10^{-19}$ cm$^3$ or less.

While various embodiments have been described above, it should be understood that they have been presented by way of example only, and not limitation. Thus, the breadth and scope of an embodiment of the present invention should not be limited by any of the above-described exemplary embodiments, but should be defined only in accordance with the following claims and their equivalents.

What is claimed is:

1. A magnetic read head, comprising:
    a multilayer seed film comprising a Ru layer positioned on an amorphous alloy, the amorphous alloy comprising a Ta-D alloy, wherein D is one or more materials selected from the group consisting of: Si and Al;
    an antiferromagnetic (AFM) layer positioned above the multilayer seed film, the AFM layer comprising a MnIr alloy having an $L_{12}$ ordered phase,
    wherein a percentage of a volume of MnIr crystal grains in the MnIr alloy having a magnetic relaxation time of about 1 msec or less with respect to a total volume of MnIr is less than about 3% at a maximum temperature of the magnetic read head during operation.

2. The magnetic read head as recited in claim 1, further comprising:
    a pinned layer positioned above the AFM layer;
    a barrier layer positioned above the pinned layer, the barrier layer comprising MgO; and
    a ferromagnetic free layer positioned above the barrier layer, the ferromagnetic free layer being configured to respond to an external magnetic field,
    wherein a magnetic moment of the pinned layer is pinned by the AFM layer.

3. The magnetic read head as recited in claim 2, wherein the pinned layer comprises:

a first ferromagnetic layer (AP1) positioned above the AFM layer;

an exchange layer positioned above the first ferromagnetic layer; and a second ferromagnetic layer (AP2) positioned above the exchange layer, wherein the exchange layer comprises substantially pure Ru, wherein the AFM layer is magnetically coupled by exchange coupling with the first ferromagnetic layer, and wherein the second ferromagnetic layer is antiparallel coupled with the first ferromagnetic layer.

4. The magnetic read head as recited in claim 1, wherein the percentage of the volume of the MnIr crystal grains in the MnIr alloy having a magnetic relaxation time of about 1 msec or less with respect to the total volume of MnIr is less than about 1% at the maximum temperature of the magnetic read head during operation, and wherein the amorphous alloy consists of the Ta-D alloy.

5. A system, comprising:
a magnetic storage medium;
at least one magnetic read head as recited in claim 1 for reading from the magnetic storage medium; and
a control unit coupled to the magnetic read head for controlling operation of the magnetic read head.

6. A magnetic read head, comprising:
a multilayer seed film comprising a Ru layer positioned on an amorphous alloy, the amorphous alloy comprising a Ta-D alloy, wherein D is a material selected from the group consisting of: Si and Al;
an antiferromagnetic (AFM) layer positioned above the multilayer seed film, the AFM layer comprising a MnIr alloy having an $L_{12}$ ordered phase,
wherein less than about 3% of polycrystalline grains forming the AFM layer have a crystal grain volume of about $1.2 \times 10^{-19}$ cm$^3$ or less.

7. The magnetic read head as recited in claim 6, further comprising:
a pinned layer positioned above the AFM layer;
a barrier layer positioned above the pinned layer, the barrier layer comprising MgO; and
a ferromagnetic free layer positioned above the barrier layer, the ferromagnetic free layer being configured to respond to an external magnetic field,
wherein a magnetic moment of the pinned layer is pinned by the AFM layer.

8. The magnetic read head as recited in claim 7, wherein the pinned layer comprises:
a first ferromagnetic layer (AP1) positioned above the AFM layer;
an exchange layer positioned above the first ferromagnetic layer; and
a second ferromagnetic layer (AP2) positioned above the exchange layer,
wherein the exchange layer comprises substantially pure Ru,
wherein the AFM layer is magnetically coupled by exchange coupling with the first ferromagnetic layer, and wherein the second ferromagnetic layer is antiparallel coupled with the first ferromagnetic layer.

9. The magnetic read head as recited in claim 6, wherein less than about 1% of polycrystalline grains forming the AFM layer have a crystal grain volume of about $1.2 \times 10^{-19}$ cm$^3$ or less, and wherein the amorphous alloy consists of the Ta-D alloy.

10. A system, comprising:
a magnetic storage medium;
at least one magnetic read head as recited in claim 6 for reading from the magnetic storage medium; and
a control unit coupled to the magnetic read head for controlling operation of the magnetic read head.

11. A method for forming a magnetic read head, the method comprising:
forming a seed layer above a substrate, the seed layer comprising an amorphous alloy film of Ta-D alloy and a Ru film thereon, wherein D is one or more materials selected from the group consisting of: Si and Al;
heating at least the substrate to a first temperature in a range from about 150° C. to about 300° C.;
forming an antiferromagnetic (AFM) layer above the seed layer after the heating, the AFM layer comprising a MnIr alloy; and
cooling at least the substrate to a second temperature of less than about 100° C.

12. The method as recited in claim 11, further comprising:
forming a first ferromagnetic layer (AP1) above the AFM layer;
forming an exchange layer above the first ferromagnetic layer;
forming a second ferromagnetic layer (AP2) above the exchange layer, wherein the first ferromagnetic layer, the exchange layer, and the second ferromagnetic layer form a pinned layer;
forming a barrier layer above the pinned layer; and
forming a ferromagnetic free layer above the barrier layer, the ferromagnetic free layer being configured to respond to an external magnetic field,
wherein a magnetic moment of the pinned layer is pinned by the AFM layer,
wherein the AFM layer is magnetically coupled by exchange coupling with the first ferromagnetic layer,
wherein the second ferromagnetic layer is antiparallel coupled with the first ferromagnetic layer, and
wherein the barrier layer comprises MgO.

13. The method as recited in claim 11, wherein the MnIr alloy has an $L_{12}$ ordered phase, and wherein a percentage of a volume of MnIr crystal grains in the MnIr alloy having a magnetic relaxation time of about 1 msec or less with respect to a total volume of MnIr is less than about 3% at a maximum temperature of the magnetic read head during operation.

14. The method as recited in claim 11, wherein the MnIr alloy has an $L_{12}$ ordered phase, and wherein less than about 3% of polycrystalline grains forming the AFM layer have a crystal grain volume of about $1.2 \times 10^{-19}$ cm$^3$ or less.

* * * * *